(12) United States Patent
Buchwalter et al.

(10) Patent No.: US 8,136,714 B2
(45) Date of Patent: Mar. 20, 2012

(54) MICRO-FLUIDIC INJECTION MOLDED SOLDER (IMS)

(75) Inventors: Stephen L. Buchwalter, Anthem, AZ (US); Peter A. Gruber, Mohegan Lake, NY (US); Paul A. Lauro, Brewster, NY (US); Jae-Woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/088,727

(22) Filed: Apr. 18, 2011

(65) Prior Publication Data

US 2011/0192887 A1    Aug. 11, 2011

Related U.S. Application Data

(62) Division of application No. 12/399,244, filed on Mar. 6, 2009, now Pat. No. 7,980,446.

(51) Int. Cl.
  *B23K 5/00* (2006.01)
  *B23K 20/08* (2006.01)
  *B22D 41/00* (2006.01)

(52) U.S. Cl. ............ 228/33; 228/256; 228/180.21; 228/180.22; 222/251; 222/288; 222/564; 222/591

(58) Field of Classification Search ............ 228/180.21, 228/180.22, 33, 256; 222/251, 288, 564, 222/591; 118/50, 406
See application file for complete search history.

(56) References Cited

U.S. PATENT DOCUMENTS

| | | |
|---|---|---|
| 3,964,509 A | 6/1976 | Daubenberger et al. |
| 4,693,209 A | 9/1987 | Leicht ............... 118/213 |
| 4,720,402 A | 1/1988 | Wojcik ............... 427/98.4 |
| 4,934,309 A | 6/1990 | Ledermann et al. ....... 118/50 |
| 5,244,143 A | 9/1993 | Ference et al. |
| 5,478,700 A | 12/1995 | Gaynes et al. ........ 430/315 |
| 5,545,465 A | 8/1996 | Gaynes et al. |

(Continued)

FOREIGN PATENT DOCUMENTS

JP    08-228073 A    9/1996

OTHER PUBLICATIONS

U.S. Appl. No. 11/869,573, filed Oct. 9, 2007 and entitled "Sprocket Opening Alignment Process and Apparatus for Multilayer Solder Decal."

(Continued)

*Primary Examiner* — Jessica L Ward
*Assistant Examiner* — Devang R Patel
(74) *Attorney, Agent, or Firm* — Ryan, Mason & Lewis, LLP

(57) ABSTRACT

A portion of compliant material includes four walls defining a slot. The slot has a relatively large cross-section end in fluid communication with a solder reservoir, and also has a relatively small cross-section end opposed to the relatively large cross-section end. The slot has a generally elongate rectangular shape when viewed in plan, with a length perpendicular to a scan direction, a width, parallel to the scan direction, associated with the relatively large cross section end, and a width, parallel to the scan direction, associated with the relatively small cross section end. The slot is configured in the portion of compliant material such that the relatively small cross-section end of the slot normally remains substantially closed, but locally opens sufficiently to dispense solder from the reservoir when under fluid pressure and locally unsupported by a workpiece. Methods of operation and fabrication are also disclosed.

2 Claims, 5 Drawing Sheets

U.S. PATENT DOCUMENTS

| | | |
|---|---|---|
| 5,673,846 A | 10/1997 | Gruber |
| 5,878,939 A | 3/1999 | Luchinger et al. |
| 6,056,191 A | 5/2000 | Brouillette et al. ........... 228/254 |
| 6,395,087 B1 | 5/2002 | Jairazbhoy et al. ........... 118/406 |
| 6,638,363 B2 | 10/2003 | Erdmann |
| 2005/0263571 A1 | 12/2005 | Belanger et al. |
| 2007/0246515 A1 | 10/2007 | Cordes et al. ............ 228/180.22 |
| 2007/0272389 A1 | 11/2007 | Gruber et al. ................. 164/488 |

OTHER PUBLICATIONS

U.S. Appl. No. 11/696,753, filed Apr. 5, 2007 and entitled "Compliant Mold Fill Head with Integrated Cavity Venting and Solder Cooling."

Gruber et al., Low-cost wafer bumping, IBM J. Res. & Dev. vol. 49, No. 4/5 Jul./Sep. 2005.

U.S. Appl. No. 12/269,240, filed Nov. 12, 2008 and entitled "Injection Molded Solder Method for Forming Solder Bumps on Substrates."

← MOLD PLATE SCAN DIRECTION

MICRO-FLUIDIC INJECTION MOLDED SOLDER (IMS)

CROSS-REFERENCE TO RELATED APPLICATIONS

This application is a divisional of U.S. patent application Ser. No. 12/399,244, filed Mar. 6, 2009, incorporated by reference herein.

FIELD OF THE INVENTION

The present invention generally relates to the electrical and electronic arts and, more particularly, to injection molded solder techniques.

BACKGROUND OF THE INVENTION

U.S. Pat. No. 5,244,143 of Ference et al. discloses an apparatus and method for injection molding solder and applications thereof. An apparatus and method are described for injection molding solder mounds onto electronic devices. The apparatus has a reservoir for molten solder which is disposed over a cavity in an injection plate. The injection plate is disposed over a mold having an array of cavities therein into which solder is injection molded. The mold is disposed over a workpiece, such as a semiconductor chip or a semiconductor chip packaging substrate. The cavities in the mold are aligned with electrical contact locations on the chip or substrate. The workpiece is heated and the molten solder is forced under gas pressure into the cavity in the injection plate disposed above the array of cavities in the mold. The molten solder is forced into the array of cavities in the mold. The injection plate is advanced to slide over the mold to wipe away the excess solder above the mold at a plurality of wiping apertures in the injection plate. The injection plate is further advanced to a location having a nonsolder wettable surface at which location the injection plate is removed. The mold is then removed to leave solder mounds disposed on the workpiece. The workpiece can be a semiconductor chip, a semiconductor chip packaging substrate or a dummy substrate onto which the injected molded solder adheres such as a polymer layer to form a carrier substrate for a solder mound array which can be subsequently transferred to a substrate such as a semiconductor chip or a semiconductor chip packaging substrate. The apparatus and methods of the invention can be integrated into an automated manufacturing system for depositing an array of solder mounds onto a substrate.

Thus, the forming of solder interconnects by injection molding the solder in a mold or decal layer is becoming more established in the industry.

SUMMARY OF THE INVENTION

Principles of the present invention provide techniques for micro-fluidic injection molded solder (IMS).

An exemplary apparatus, according to an aspect of the invention, includes a solder reservoir and a portion of compliant material. The portion includes four walls defining a slot, the slot having a relatively large cross-section end in fluid communication with the solder reservoir, and also having a relatively small cross-section end opposed to the relatively large cross-section end. The slot has a generally elongate rectangular shape when viewed in plan, with a length perpendicular to a scan direction, a width, parallel to the scan direction, associated with the relatively large cross section end, and a width, parallel to the scan direction, associated with the relatively small cross section end. The slot is configured in the portion of compliant material such that the relatively small cross-section end of the slot normally remains substantially closed, but locally opens sufficiently to dispense solder from the reservoir when under fluid pressure and locally unsupported by a workpiece.

In another aspect, the combination of an apparatus, as described, with a suitable workpiece having solder-receiving cavities, is contemplated.

In still another aspect, an exemplary method includes the steps of providing a workpiece having a plurality of solder-receiving cavities defined therein; providing an apparatus of the kind described; and scanning the workpiece, relative to the slot in the portion of compliant material, in the scan direction, with the small cross-section end of the slot in contact with the workpiece, and with the fluid pressure applied at least when the slot is aligned with given ones of the cavities, to sequentially dispense solder from the reservoir into the given ones of the cavities.

In an even further aspect, a method of fabricating embodiments of the apparatus includes providing a sheet of elastomeric material; and cutting a first long incision along a surface of the material to form a first straight wall making an angle, $\alpha$, with horizontal, the first long incision describing a line along the surface of the sheet. Also included is cutting a second long incision along a surface of the material to form a second straight wall making an angle, $\beta$, with horizontal, the second long incision beginning at the line along the surface of the sheet, such that a slot is formed. The slot has a relatively large cross-section end and a relatively small cross-section end opposed to the relatively large cross-section end. A further step includes securing the sheet to a solder reservoir such that the relatively large cross-section end is in fluid communication therewith.

These and other objects, features and advantages of the present invention will become apparent from the following detailed description of illustrative embodiments thereof, which is to be read in connection with the accompanying drawings (note that section lining is generally omitted from the drawings, except for solder-filled regions, in order to avoid clutter).

DETAILED DESCRIPTION OF PREFERRED EMBODIMENTS

One or more embodiments of the invention are of interest, for example, to integrated circuit solder interconnects, and more specifically the emerging field of injection molded solder processing for forming solder interconnects. One or more embodiments of the invention provide a microfluidic IMS structure and process, including a solder slot that functions to dispense molten solder (fluid). Typically having a width in the direction parallel to the scan from zero to only several microns, the inventive slot:

- is capable of being lifted while the solder is molten without any solder leakage
- significantly reduces the build up of solder oxide, compared to prior-art techniques, since there is very little molten solder in contact with the ambient environment
- provides optimal pressure (mechanical force per unit area) to enhance wiping and sealing
- provides optimized cavity fill properties without the need & complexities of solidification.

Figure 1:
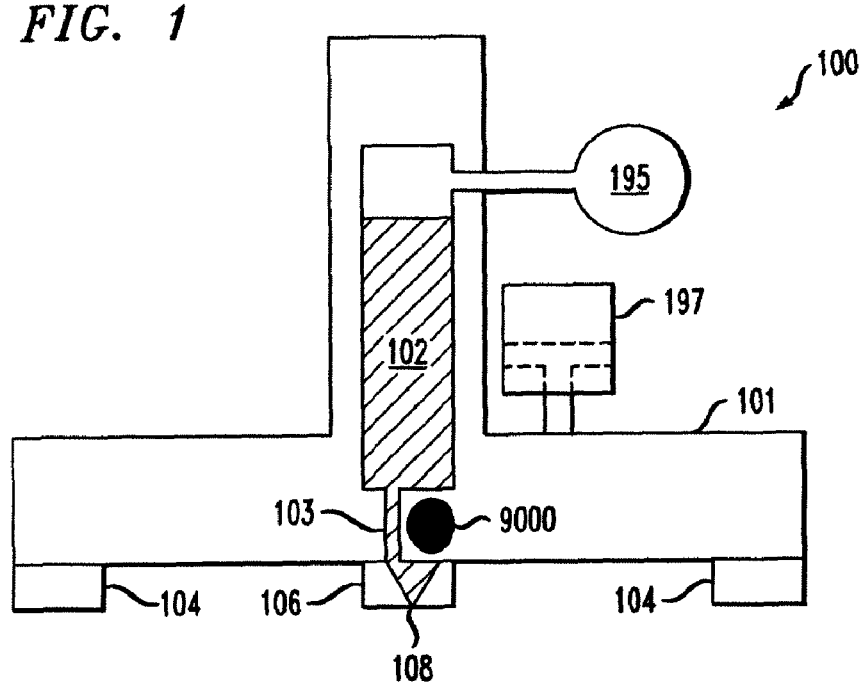
FIG. 1 is a side view of an exemplary embodiment of a micro-fluidic (MF) IMS head, according to an aspect of the invention.

FIG. 1 shows exemplary MF IMS head 100 with a microfluidic (MF) solder slot. As seen at location 108, the head 100 has a "V" shape cut from top to bottom cut into a compliant material 106. This material functions both as a solder seal as well as a micro valve. When the solder reservoir 102 is NOT pressurized, the V-shaped MF slot is completely closed, thus preventing solder from leaking out, even if the head 100 is lifted. In effect, the bottom width of the MF slot is essentially zero. To cut this slot, mechanical or other techniques are employed to cut an initial angle into the compliant material 106; then, the slot just formed is also used as the starting point to cut a second angle, from the bottom side, thus forming the V shape. Since the slot 108 at the bottom face of the compliant material 106 is essentially closed, there is little to no solder in contact with the ambient environment, thus significantly reducing solder oxide (dross) formation. Note low friction elastomeric regions 104 at the leading and trailing edges.

In typical embodiments, materials 104 and 106 are the same, except that material 106 has the slot 108 cut therein.

Note that exemplary head 100 includes foot 101, which mounts material 106 and regions 104. Head 100 also includes connecting channel 103 which connects solder reservoir 102 to V-shaped MF slot 108.

Figure 2:
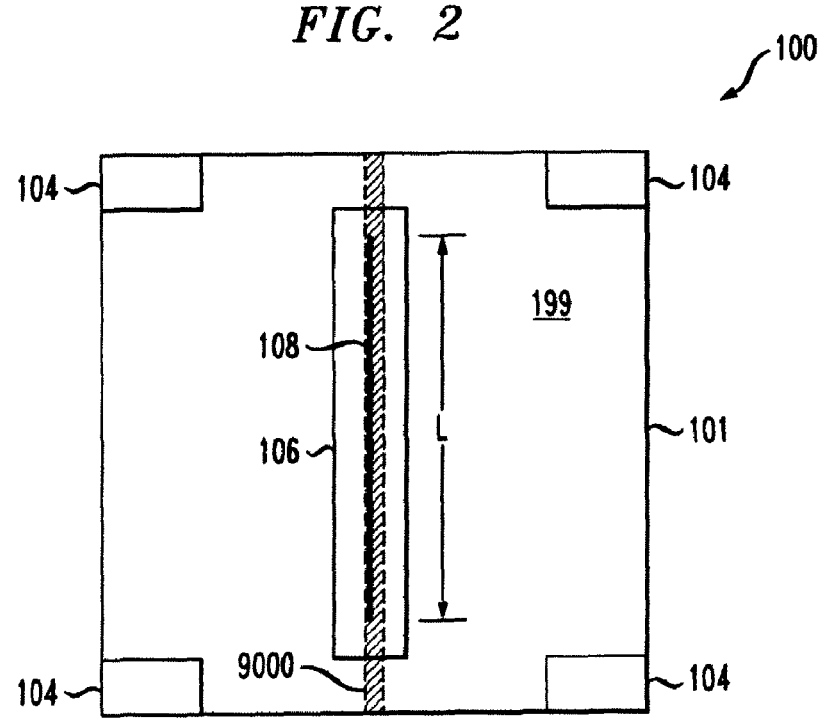
FIG. 2 is a bottom view of the solder head of FIG. 1.

As shown in FIG. 2, there is only a relatively small amount of compliant material 106 on the bottom of the head 100. Thus, at a given absolute joining force, the pressure (force per unit area) on the compliant material 106 is much higher than if the entire bottom surface of the head were covered by the material 106. This provides good wiping characteristics as well as allowing the compliant material 106 to better track significant surface topography of the decals or molds that it scans over. This is especially required for bumping laminate or organic substrates that have substantially greater surface topography than polished glass molds. Finally, since the compliant material 106 that contains the MF V slot 108 is relatively narrow, the amount of material in contact with the molten solder as the trailing edge wipes over filled cavities is also reduced, which improves fill quality. As seen in the bottom view in FIG. 2, low friction elastomeric regions 104 are preferably in the form of four distinct "corner caps" located in the corners, to provide stability for the head 100. Caps 104 may be formed, for example, from the same material as region 106, as will be discussed further below.

In many instances, the workpiece (for example, mold plate or substrate with mask, as discussed below) is at a lower temperature than the melting temperature of the solder. Accordingly, some embodiments include a heater element 9000 disposed adjacent the relatively large cross-section end of the slot 108. Heater element 9000 heats the solder to prevent premature solidification of the solder. Heater element 9000 is preferably located as close to the solder injection point as possible. As seen in FIGS. 1 and 2, in non-limiting exemplary embodiments, connecting channel 103 is "jogged" as needed to provide room for the element 9000. Given the teachings herein, the skilled artisan will be able to size the heater element (physical dimensions and wattage) depending on the temperature of the workpiece, ambient temperature, melting point of the solder, materials of construction, and the like, using thermal analysis tools such as, for example, ANSYS® software available from ANSYS, Inc., Canonsburg, Pa. 15317, USA.

Figure 3:
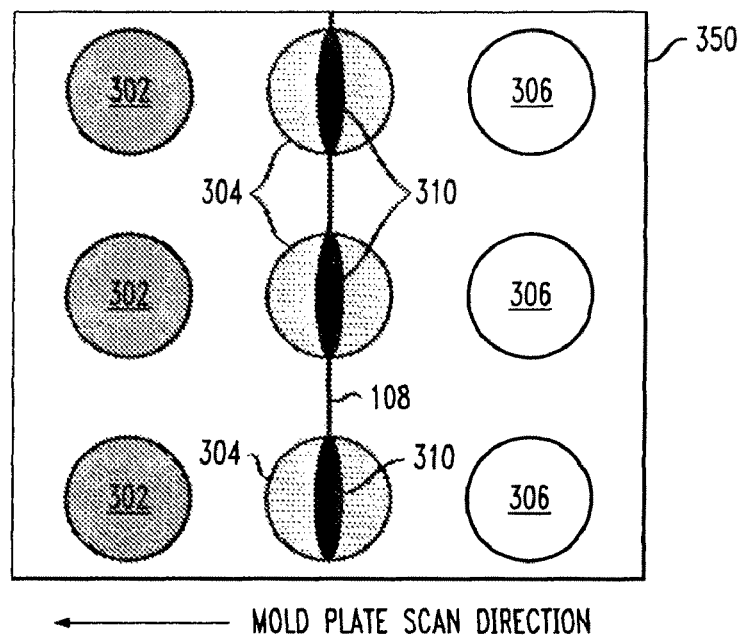
FIG. 3 is a bottom view of the MF solder slot of the solder head of FIG. 1, superimposed over mold cavities.

FIG. 3 shows a magnified bottom view of the MF V slot 108 superimposed over a mold plate 350 with cavities (plate 350 may be, for example, glass). With a downward force over the compliant material 106 that contains the MF V slot 108, a selective opening of the V slot occurs as shown (material 106 is not shown per se in FIG. 3). In particular, the mold plate moves (scans) relative to the slot in the direction shown, such that cavities 302 have already been filled, cavities 306 are empty, and cavities 304 are in the process of being filled. Slot 108 remains generally closed, or only slightly open, away from cavities 304, but as seen in regions 310, opens up (for example, a few microns) over cavities 304. The selective opening of the V-slot 108 is due to two factors: 1) the cavity opening below the slot, and 2) the positive reservoir pressure. The MF V slot 108 opens more over the unsupported cavity space 310 than it does over the supported space between the cavities. Thus, the slot opens preferentially over cavities, such that the cavities can be filled under positive reservoir pressure. In one or more embodiments, this pressure needs to be greater than for the much wider (that is, wider in the direction parallel to the scan), always-open solder slots of the prior art. Thus, the pressure forces the MF V slot 108 open, in conjunction with the cavity 304. Once the pressure is off, the slot quickly closes again.

Figure 4:
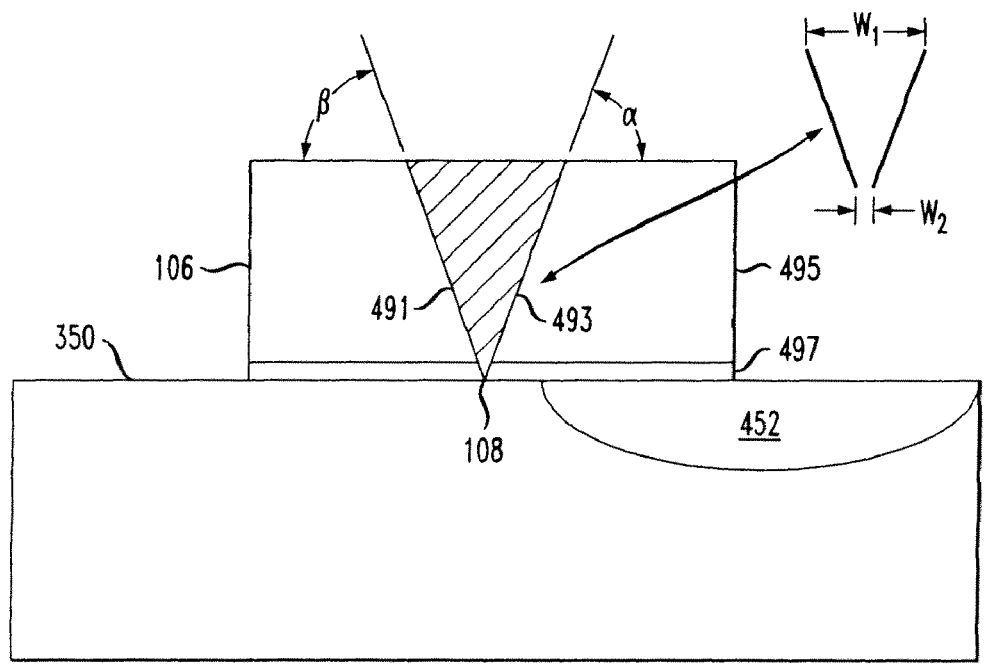
FIG. 4 is a side view of the MF solder slot of the solder head of FIG. 1, between the cavities.

As seen in FIG. 4, which is a magnified side view of the MF V slot 108, in the areas between mold or decal cavities 452, the slot is essentially closed. Thus, there is little to no solder in contact with the ambient environment, reducing or even minimizing oxidation.

Figure 5:
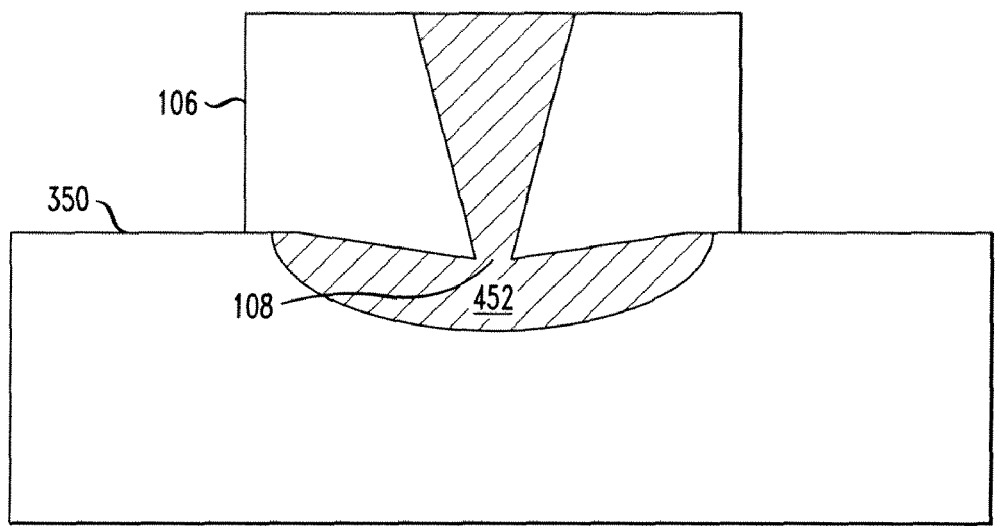
FIG. 5 is a side view of the MF solder slot of the solder head of FIG. 1, over a cavity during fill.

FIG. 5 shows the MF V slot 108 in a magnified side view disposed over a cavity 452 in the mold plate 350. At this point, the combination of reservoir pressure plus an unsupported or unconstrained compliant coating 106 opens the MF V slot 108, allowing it to dispense molten solder into the cavity 452. Since the MF V solder slot 108 is preferably the same width, or even narrower, than the cavity 452, it results in enhanced, and preferably optimal, fill quality. The reason for this is that the solder exits the MF V slot 108 under relatively high pressure, and is thus able to completely push any residual ambient gas out of the cavity 452, as it enters from one side. This produces consistent edge to edge fill of the cavities 452, with similar fill quality to that seen in the more complex IMS fill technology called "solidification," known to the skilled artisan from U.S. Patent Publication No. 2005-0263571A1 entitled "Injection molded continuously solidified solder method and apparatus."

Figure 6:
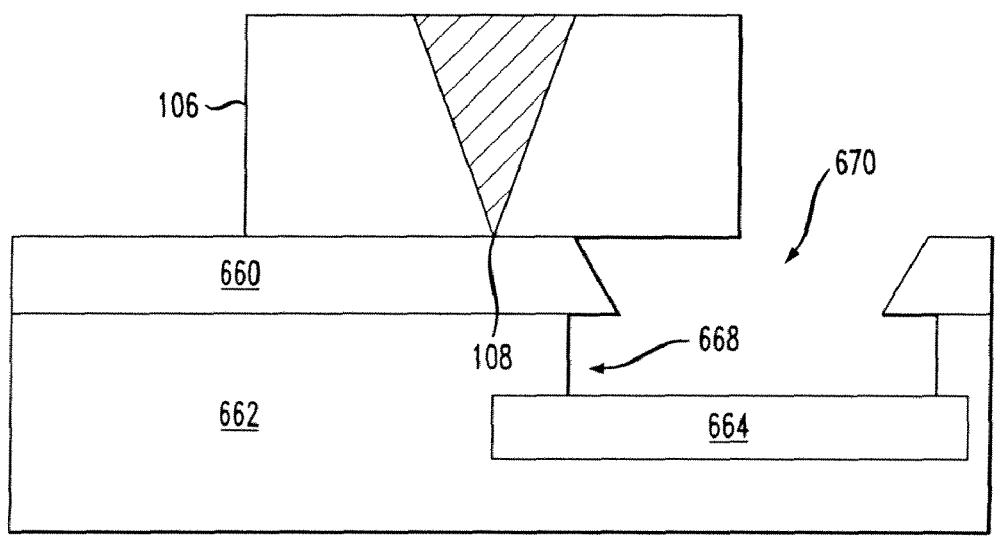
FIG. 6 is a side view of the MF solder slot of the solder head of FIG. 1, between vias of an organic substrate.

FIG. 6 shows another magnified side view of a MF V slot 108, this time positioned over an organic substrate 662 having an aligned mask or decal 660 disposed over it (for example, a polyimide film or a thin material that does not react with solder (e.g., non-wetting metals such as molybdenum, stainless steel, aluminum, and the like)). Here again the MF V slot is closed since it is constrained while positioned over the space between decal and via openings, 670, 668 respectively, in the organic substrate 662. Note also wetting surface 664 (for example, copper, gold, nickel, and the like).

Non-limiting examples of organic substrates include laminate materials made of glass fibers in an epoxy; for example, FR-4 (flame retardant type 4) and BT-resin (Bismaleimide Triazine resin). Furthermore, it should be noted that the invention is not limited to organic substrates; element 662 is also representative of a ceramic substrate or a silicon wafer, as aspects of the invention can also be employed to dispense solder on ceramic substrates or silicon wafers. Thus, the wettable pads 664 depicted in the figures also encompass ball-limiting metallurgy, in the case of a silicon substrate (although wetting pads on silicon would typically not be recessed in a deep via).

Figure 7:
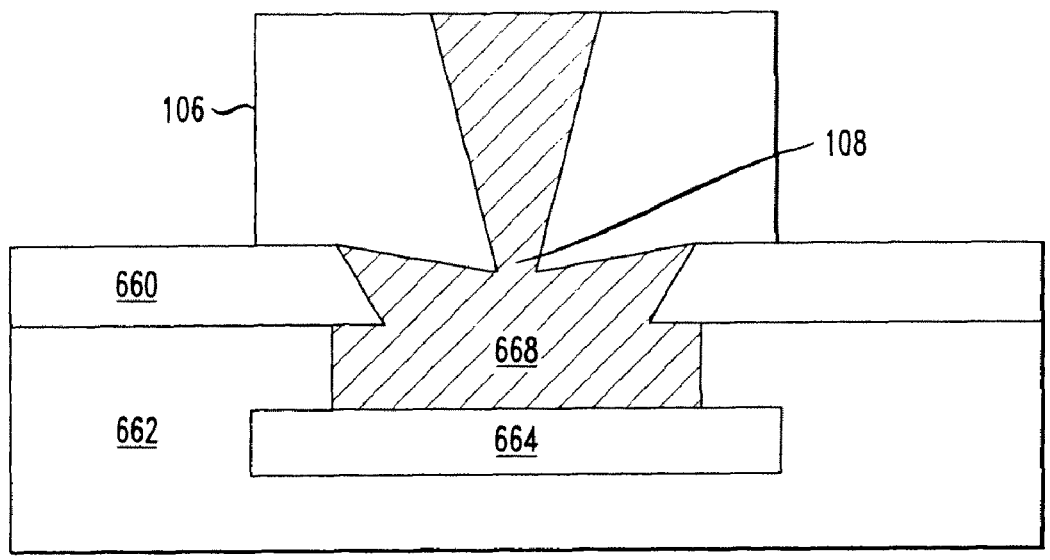
FIG. 7 is a side view of the MF solder slot of the solder head of FIG. 1, over a via of the organic substrate during solder fill.

FIG. 7 shows a magnified side view of the MF V slot 108, now positioned over the opening in decal 660 and the via opening 668, causing the slot 108 to dispense solder in a manner similar to FIG. 5.

Figure 8:
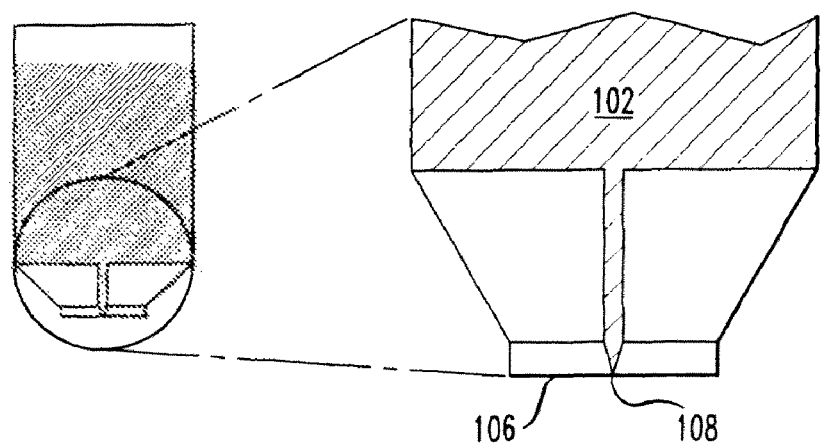
FIG. 8 shows the solder head of FIG. 1 in a lifted condition.

FIG. 8 is a broader side view showing the main components of the micro-fluidic IMS head. Included are the solder reservoir 102 containing molten alloy, either pressurized or not, the compliant material 106 containing the MF V slot 108, and the MF V slot 108 itself which, even with the head lifted away from either a glass mold plate or an organic laminate substrate, prevents the molten alloy in reservoir 102 from leaking due to its "closed" configuration. When the head is lifted while the alloy is molten, the reservoir is NOT pressurized, to avoid leakage.

Figure 9:
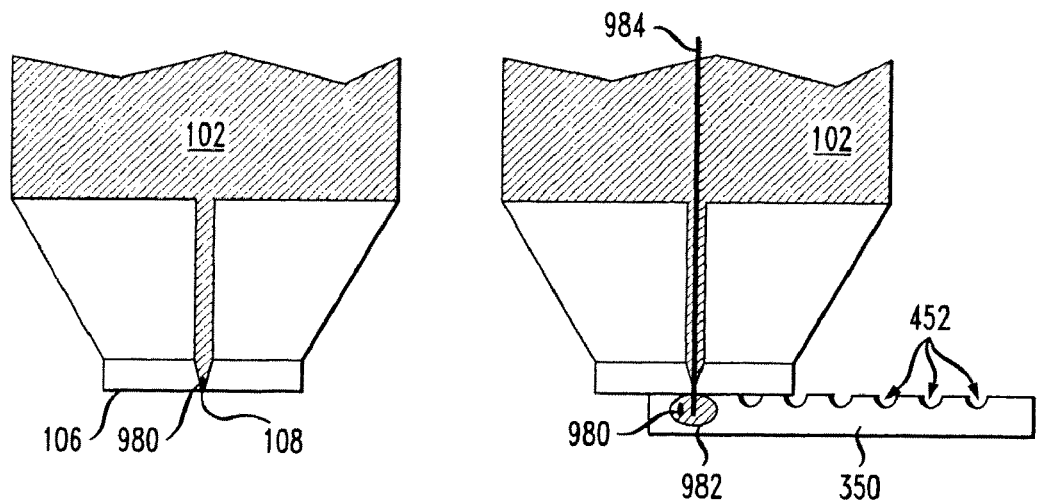
FIG. 9 shows a dross (solder oxide) particle lodged in the opening of the MF solder slot of the solder head of FIG. 1, and a stainless steel blade dislodging same.

FIG. 9 shows the first of two exemplary approaches to remove possible dross particles 980 that may block part of the MF V slot 108. The example in FIG. 9 employs a thin stainless steel blade 984 that is momentarily pushed through the MF V slot 108 while it is positioned over a "cleaning" trench 982 which traps the dross 980 thus removed. The trench preferably extends into and out of the plane of the illustration with a dimension sufficient to accommodate the blade (that is, it is not a series of holes where the blade would hit the regions between the holes, but rather a continuous trench). In addition to stainless steel, other materials non-wettable by solder, such as molybdenum or anodized aluminum, can be used.

Figure 10:
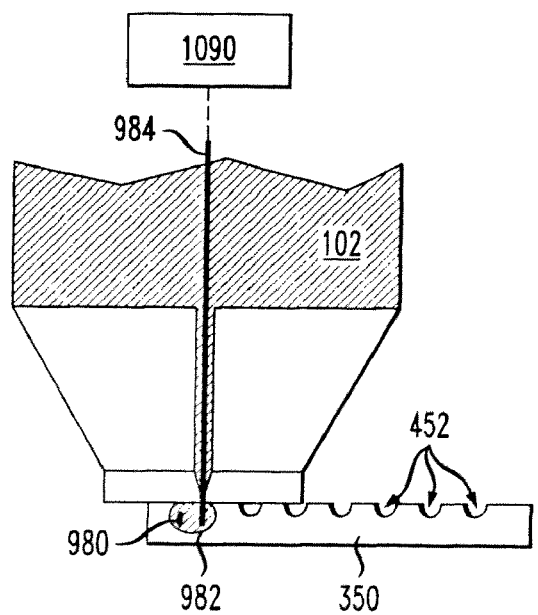
FIG. 10 shows a similar dross dislodging blade attached to an ultrasonic transducer to provide additional mechanical forces.

Finally, FIG. 10 shows a second dross cleaning approach. In this embodiment, the thin stainless steel blade 984 is connected to an ultrasonic transducer 1090 to enhance the ability to dislodge and remove dross particles 980 that may block some of the MF V slot geometry 108. Transducer 1090 may induce, for example, low amplitude, high-frequency motion of blade 984 in one, two, or three Cartesian dimensions.

Thus, aspects of the invention provide a Micro-Fluidic Injection Molded Solder Structure and Process that use an inventive IMS head with a solder slot structure that dispenses molten solder by a microfluidic valving process. One or more embodiments provide one or more advantages for many applications, such as solder bumping organic substrates that have significant surface topography. In addition, one or more embodiments provide hot-lift capability, reduced oxide formation, and/or enhanced (or even optimized) fill quality for cavities or vias that are filled with molten solder. In one or more embodiments, the opening of slot 108 (when positioned over a cavity and under pressure, as in regions 310) is a few microns; for example, from about 2 microns to about 10 microns. The rather small slot opening typically results in laminar flow of the solder. With reference to FIG. 4, angles alpha and beta may each range from about 30 degrees to about 70 degrees, with a more preferred range of about 45 degrees to about 60 degrees. Further, in at least some preferred cases, alpha and beta are not equal; for example, alpha could be about 30 to about 70 degrees, or more preferably about 45 to about 60 degrees, and most preferably about 45 degrees; and beta could be approximately straight (that is, about 90 degrees). It has been found that such an approach may lead to ease in fabrication and fixturing. In particular, a blade may be inserted to form an approximately 45 degree cut for angle alpha, and the blade may again be inserted at the same point (apex of the "V") to make a straight cut (beta=90 degrees). In such a case, the "V" is of course not symmetrical about a vertical axis.

The long dimension of slot 108 can be, for example, about 1 inch (2.54 cm) to about 1.5 inches (3.81 cm); however, where appropriate (such as for wafer bumping), the length could be over 8 inches (20.32 cm), or even up to about 12 inches (30.48 cm) or longer.

Note that there is relative motion between the solder head 100 and the cavities, such as 452, which will receive the molten solder. In some cases, the solder head is stationary; while in other embodiments, the solder head may move while the other components are stationary.

In a non-limiting example, the hydrostatic pressure of the solder (when it is desired to open the slot 108) is about 5 to about 20 pounds per square inch gauge (PSIG) with a preferred value of about 12 PSIG (about 34.5 to about 138 kilo-Pascals with a preferred value of about 82.7 kilo-Pascals) ("gauge" refers to the amount above ambient atmospheric pressure; the amounts in kilo-Pascals are also given above ambient atmospheric pressure). Furthermore, in a non-limiting example, the mechanical pressure between the head 100 and workpiece (that is, mold 350 or decal 660) is about 15 to about 20 PSI (about 103 to about 138 kilo-Pascals); these values are exemplary and non-limiting (in the general case, it is desirable to avoid the hydrostatic pressure from "lifting" the head and yet also avoid having so much mechanical contact force that the slot significantly distorts).

Recalling FIG. 1, note that fill head 100, which may be, for example, glass or metal, is provided with compliant material 106, which spreads out (distributes uniformly, or nearly so) the compressive force between (i) head 100 and (ii) mold 350 or decal 660 on substrate 662, as the case may be, resulting in good contact.

Compliant material 106 may include, for example, a bulk compressible layer with a thin low-friction layer adjacent mold 350 or decal 660 on substrate 662, as the case may be. Non-limiting examples of compliant materials for the bulk compressible layer are (i) low durometer pure silicone rubber and (ii) silicone closed cell sponge. Non-limiting examples of materials for the low-friction layer are fluoropolymers such as Teflon® (registered mark of E. I. Du Pont De Nemours And Company, Wilmington, Del., USA), fiberglass reinforced Teflon® material, and Rulon® TFE Fluorocarbon (registered mark of Saint-Gobain Performance Plastics Corporation, Aurora, Ohio USA). The low-friction layer may be, for example, just thick enough to resist abrasion (for example, about 0.010 inches or about 0.254 mm). The total thickness of the low friction layer plus the bulk compressible layer may be, for example, from about 1/32 inch to about 1/4 inch, with a preferred thickness of about 1/16 inch (from about 0.79 mm to about 6.35 mm, with a preferred thickness of about 1.59 mm).

Note that a V-shape is preferred for slot 108; however, any shape where increased pressure causes a normally closed slot to open slightly can be used; for example, the walls of the "V," instead of being straight, could be curved to some extent. Further, the slot should have a narrow, normally-closed portion against the decal or mold, with a wider portion that interfaces with the connecting channel 103.

In view of the discussion thus far, it will be appreciated that, in general terms, an exemplary apparatus, according to an aspect of the invention, can include a solder reservoir 102 and a portion of compliant material 106. The portion 106 can include four walls defining a slot 108. The slot has a relatively large cross-section end in fluid communication with the solder reservoir 102, and a relatively small cross-section end opposed to the relatively large cross-section end. As best seen in FIG. 2, the slot has a generally elongate rectangular shape when viewed in plan (that is, top or bottom view perpendicular to the plane of the slot). As best seen in FIGS. 2-4, slot 108 has a length, L, perpendicular to the scan direction, a width, $W_1$, parallel to the scan direction, associated with the relatively large cross section end, and a width, $W_2$, parallel to the scan direction, associated with the relatively small cross section end. $W_2$ may be zero when the slot is closed; this condition is shown in the main part of FIG. 4 while a slight opening is shown in the inset. The slot 108 is configured in the portion of compliant material 106 such that the relatively small cross-section end of the slot normally remains substantially closed, but locally opens sufficiently to dispense solder from the reservoir 102 when under fluid pressure and locally unsupported by a workpiece (as in regions 310). As used herein, including the claims, "substantially closed" means completely closed, such that the sides are in contact, or only very slightly open (roughly, less than about 2 microns), such that weeping out of solder does not occur, or occurs to such a slight amount that mold filling is not interfered with.

As best seen in FIG. 4, in one or more embodiments, the four walls include a first straight wall 493 running along the length perpendicular to the scan direction, the first straight wall making an angle, a, with horizontal, and a second straight wall running along the length perpendicular to the scan direction, the second straight wall 491 making an angle, β, with horizontal, the first and second straight walls meeting at the relatively small cross-section end. It should be noted that, as used herein, including the claims, "four walls" may include, for example, the aforementioned walls 491 and 493, with the ends of the slot formed by any kind of walls, for example, curved, straight, and so on.

As discussed above, in some cases, α=β, such that the slot is symmetrically V-shaped when viewed in cross-section along the length perpendicular to the scan direction.

In some instances, the relatively small cross-section end of the slot (that is, where the leader from reference character 108 points in FIG. 4), when locally open under the fluid pressure (as at regions 310 in FIG. 3), has a width parallel to the scan direction of from about 2 microns to about 10 microns. Furthermore, the portion of compliant material 106 can be configured such that the local opening under the fluid pressure occurs when the fluid pressure is from about 5 to about 20 PSIG, and most preferably about 12 PSIG. Fluid pressure can be provided by a source of fluid pressure 195 as seen in FIG. 1; for example, a compressor or flask may be provided to provide an overpressure with $N_2$ another inert gas.

In one or more embodiments, the long dimension L of the slot, as best seen in FIG. 2, can be about 1 inch to about 12 inches; that is, the first and second straight walls 493, 491 have a length of from about 1 inch to about 12 inches.

In at least some instances, an actuator 197, as seen in FIG. 1, is configured to urge the portion of compliant material 106 against an external workpiece (for example, mold 350 or decal/substrate combination 660, 662) with a mechanical contact pressure of from about 15 PSI to about 20 PSI. This mechanical contact pressure is defined as the force divided by the total area of region 106 and the four corner caps 104.

In one or more embodiments, the apparatus also includes a dross-removing knife 984 disposed for vertical motion in the slot 108; optionally, with an ultrasonic actuator 1090 coupled to the knife.

In a preferred but non-limiting embodiment, a foot 101 is also included. The portion of compliant material 106 is mounted to the foot 101, and the solder reservoir 102 is secured to the foot 101. Fluid communication may in any case be provided, for example, by connecting channel 103. As seen in FIG. 2, the foot 101 is generally rectangular when viewed in plan and has a bottom surface 199. Elastomeric corner caps 104 are secured to the bottom surface 199 of the foot 101.

As best seen in FIG. 4, the portion of compliant material 106 can include, for example, a bulk compressible layer 495 and an attached low-friction layer 497 adapted to be positioned against a workpiece, such as mold 350 or decal 660 with substrate 662. The portion of compliant material 106 can have a total thickness of from about 1/32 inch to about 1/4 inch. The bulk compressible layer 495 can be, for example, low durometer pure silicone rubber or silicone closed cell sponge, and the low-friction layer 497 can be a fluoropolymer (which may or may not be reinforced with fiberglass or the like).

In another aspect, an exemplary method includes the step of providing a workpiece having a plurality of solder-receiving cavities defined therein. The workpiece can be, for example, mold plate 350 with cavities 452 or a substrate assembly formed from substrate 662 with solder-receiving cavities 668 and mask structure 660 disposed over the substrate. The mask structure has a plurality of solder through-holes 670 aligned with the solder-receiving cavities 668 in the substrate. Additional steps include providing an apparatus such as apparatus 100, and scanning the workpiece, relative to the slot 108 in the portion of compliant material 106, in the scan direction, with the small cross-section end of the slot in contact with the workpiece, and with the fluid pressure applied at least when the slot is aligned with given ones of the cavities, to sequentially dispense solder from the reservoir 102 into the given ones of the cavities. In at least some instances, the method also includes removing the fluid pressure, and, subsequent to the removing step, lifting the compliant material 106 from the workpiece.

Aspects of the invention further contemplate the combination of a workpiece having a plurality of solder-receiving cavities defined therein; and an apparatus 100 of the kind described. A variety of different types of workpieces are possible. One type of workpiece is a mold plate 350 with cavities 452. Another type of workpiece is a substrate 662 as shown in FIG. 7, which in at least some cases could be used in a maskless fashion (i.e., head 106 dispenses solder from slot 108 into regions 668 (an example of solder-receiving cavities) to adhere to recessed pad 664, without use of mask 660). Still another type of workpiece is a substrate assembly. Such an assembly includes a substrate 662 and a mask structure 660. "Assembly" does not necessarily imply physical fastening but also contemplates mere alignment. Through holes in the mask 660 are aligned with the pads 664. Recessed pads 664 with regions 668 are an example of solder-receiving cavities. As used in the claims, to avoid confusion with the substrate used without a mask, the substrate 662 in this aspect is referred to as a "substrate assembly substrate" and the mask 660 is referred to as a "substrate assembly mask structure."

Still another example of a workpiece is a wafer assembly. Again, "assembly" does not necessarily imply physical fastening but also contemplates mere alignment. Such an assembly includes a wafer having solder-receiving regions and a wafer mask structure disposed over the wafer. This aspect can be visualized by considering FIG. 7 if the pads 664 were not recessed, but rather even with the upper surface of element 662, such that there were no regions 668. In this case, mask 660 would need to be used. Mask 660 in this case could be referred to as a wafer mask structure. The plurality of through-holes in the mask would be aligned with the solder-receiving regions (non-recessed pads) in the wafer to form the solder-receiving cavities.

In some instances, the apparatus includes dross-removing knife 984 disposed for vertical motion in the slot 108, and the workpiece is formed with a dross-receiving trench 982 (that is, a trench, as described above, formed in the workpiece that is separate and distinct from the cavities intended to receive solder for interconnect-forming purposes).

In still a further aspect, an exemplary method includes the steps of providing a sheet of elastomeric material 106 and cutting a first long incision along a surface of the material to form a first straight wall 493 making an angle, $\alpha$, with the horizontal. The first long incision describes a line along the surface of the sheet 106. An additional step includes cutting a second long incision along a surface of the material to form a second straight wall 491 making an angle, $\beta$, with horizontal. The second long incision begins at the line along the surface of the sheet, such that a slot is formed, with a relatively large cross-section end and a relatively small cross-section end opposed to the relatively large cross-section end. A further step includes securing the sheet to a solder reservoir 102 such that the relatively large cross-section end is in fluid communication therewith. Values of $\alpha$ and $\beta$ can be as set forth above.

Typical dimensions for cavities such as 452 can be, for example, 100 micron diameter and 30 microns deep. Typical dimensions for openings 670 and cavities 668 can be, for example, 100 microns in width and 65 microns deep. Typical dimensions for a cleaning trench 982 can be, for example, 2-12 inches (about 5.1-30.5 cm) long by 250 microns wide and 250 microns deep. All dimensions given in this paragraph are approximate.

The methods described above can be used in the fabrication and packaging of integrated circuit chips; in particular, techniques set forth herein can be used to make arrays of solder balls for attachment to an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products, having a display, a keyboard or other input device, and a central processor. The techniques set for the herein can be used for interconnecting the chip on chips or chip stacks for 3D applications, chips on wafers, chips on package or package on package.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising the steps of:
   providing a workpiece having a plurality of solder-receiving cavities defined therein;
   providing an apparatus comprising:
      a solder reservoir; and
      a portion of compliant material, said portion comprising four walls defining a slot, said slot having a relatively large cross-section end in fluid communication with said solder reservoir, said slot having a relatively small cross-section end opposed to said relatively large cross-section end, said slot having a generally elongate rectangular shape when viewed in plan, with:
         a length perpendicular to a scan direction,
         a width, parallel to said scan direction, associated with said relatively large cross section end, and
         a width, parallel to said scan direction, associated with said relatively small cross section end,
      said slot being configured in said portion of compliant material such that said relatively small cross-section end of said slot normally remains substantially closed, but transitions to sufficiently open to dispense solder from said reservoir when a pressure from a workpiece substantially decreases while said slot is under fluid pressure, wherein said apparatus further comprises a dross-removing knife disposed for vertical motion in said slot;
   scanning said workpiece, relative to said slot in said portion of compliant material, in said scan direction, with said small cross-section end of said slot in contact with said workpiece, and with said fluid pressure applied at least when said slot is aligned with given ones of said cavities, to sequentially dispense solder from said reservoir into said given ones of said cavities;
   removing said fluid pressure; and
   subsequent to said removing step, lifting said compliant material from said workpiece.

2. The method of claim 1, wherein:
   said workpiece is at a lower temperature than a melting temperature of said solder; and
   said apparatus further comprises a heater element disposed adjacent said relatively large cross-section end of said slot;
   further comprising the additional step of heating said solder with said heater element to prevent premature solidification of said solder.

* * * * *